(12) United States Patent
Jin et al.

(10) Patent No.: US 11,160,187 B1
(45) Date of Patent: Oct. 26, 2021

(54) CONTAINER CADDY FOR COMPUTER NETWORK TRANSCEIVERS

(71) Applicant: Facebook, Inc., Menlo Park, CA (US)

(72) Inventors: Tiffany Jin, San Mateo, CA (US); Che Kin Leung, Fremont, CA (US)

(73) Assignee: Facebook, Inc., Menlo Park, CA (US)

( * ) Notice: Subject to any disclaimer, the term of this patent is extended or adjusted under 35 U.S.C. 154(b) by 13 days.

(21) Appl. No.: 16/399,617

(22) Filed: Apr. 30, 2019

(51) Int. Cl.
*H05K 7/14* (2006.01)
*H04B 10/40* (2013.01)

(52) U.S. Cl.
CPC .......... *H05K 7/1498* (2013.01); *H04B 10/40* (2013.01); *H05K 7/1488* (2013.01); *H05K 7/1491* (2013.01)

(58) Field of Classification Search
CPC .. H05K 7/1498; H05K 7/1491; H05K 7/1488; H04B 10/40
See application file for complete search history.

(56) References Cited

U.S. PATENT DOCUMENTS

| 5,193,925 | A | * | 3/1993 | Foulke | A47B 21/0371 |
| | | | | | 150/165 |
| 5,244,397 | A | * | 9/1993 | Anhalt | G06K 7/0047 |
| | | | | | 439/101 |
| 9,995,898 | B2 | * | 6/2018 | Krampotich | G02B 6/4455 |
| 2005/0179442 | A1 | * | 8/2005 | Coissac | G01R 31/60 |
| | | | | | 324/542 |
| 2012/0062091 | A1 | * | 3/2012 | Donowho | H04Q 1/062 |
| | | | | | 312/351.1 |
| 2013/0094864 | A1 | * | 4/2013 | Duis | H04B 10/40 |
| | | | | | 398/139 |
| 2014/0219622 | A1 | * | 8/2014 | Coan | H02G 3/08 |
| | | | | | 385/135 |
| 2014/0259650 | A1 | * | 9/2014 | Carter | G09B 23/182 |
| | | | | | 29/825 |
| 2018/0020569 | A1 | * | 1/2018 | Wang | H04Q 1/06 |
| 2018/0309519 | A1 | * | 10/2018 | Yuda | H04B 1/036 |

* cited by examiner

*Primary Examiner* — Hung S. Bui
*Assistant Examiner* — Sagar Shrestha
(74) *Attorney, Agent, or Firm* — Van Pelt, Yi & James LLP

(57) ABSTRACT

In an embodiment, an assembly includes a container caddy including a plurality of compartments corresponding to at least a portion of ports of a computer networking equipment. Each compartment of at least a portion of the plurality of compartments is configured to hold a corresponding computer network transceiver corresponding to a corresponding port of the ports of the computer networking equipment. The assembly includes a coupler portion configured to allow the assembly to be removably hung on an external object. The assembly includes a grounding portion configured to provide electrostatic discharge grounding.

21 Claims, 10 Drawing Sheets

Network transceiver (first row) 502

Network transceiver (second row) 504

CONTAINER CADDY FOR COMPUTER NETWORK TRANSCEIVERS

BACKGROUND OF THE INVENTION

A data center supports a variety of IT operations such as cloud computing and large-scale services such as application or data services. A data center houses racks of computer servers, which provide processing and data storage functionalities. The processing and data storage functionalities are implemented by networking equipment such as processors, switches, and routers in the server racks. Servicing network equipment can be time consuming, prone to errors, and potentially damage vulnerable devices. Technicians replacing or repairing network equipment such as switches need to track an order of transceivers in a module when they remove the transceivers from the module. Techniques for tracking network equipment typically involves hand-labeling each transceiver, which is tedious and inefficient.

BRIEF DESCRIPTION OF THE DRAWINGS

Various embodiments of the invention are disclosed in the following detailed description and the accompanying drawings.

DETAILED DESCRIPTION

Figure 2:
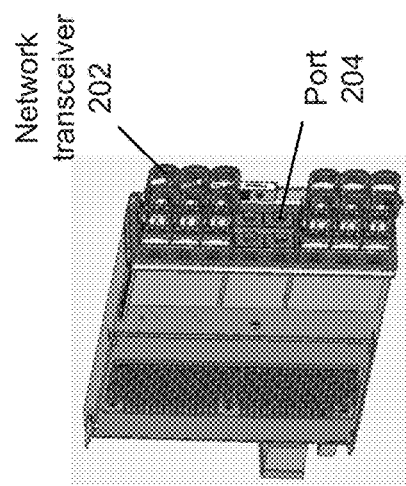
FIG. 2 shows an example of an interface module with network transceivers for which a container caddy for computer network transceivers can be used.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A container caddy (e.g., assembly) for computer network transceivers is disclosed. The container caddy is adapted to receive/store transceivers in an organized manner. In one aspect, a technician will not confuse transceivers and no longer needs to label the transceivers. In another aspect, the transceivers are securely stored so that they are less prone to damage and require less maintenance such as cleaning. In yet another aspect, transceivers can remain attached to their cables so that they do not need to be disconnected during servicing. This reduces the time and labor involved to service networking equipment and improves the functioning of data centers.

In an embodiment, an assembly includes a container caddy, a coupler portion, and a grounding portion. The container caddy includes compartments corresponding to ports of a computer networking equipment. Each compartment (of at least some of the compartments) is configured to hold a corresponding computer network transceiver corresponding to a corresponding port of the computer networking equipment port. For example, the computer networking equipment is an interface card with ports to receive optical transceivers. Compartments of the container caddy are slots adapted to hold the transceivers in an ordered manner and safely store them by protecting them from static or other damage. The container caddy assembly keeps the transceivers and module cables protected and in an organized order. For example, the assembly may include a cable management portion such as a spool and Velcro (adhesive) on the bottom for managing a grounding cable and Velcro (adhesive) on the sides for managing network (e.g., optical transceiver) cables. The assembly can be used for servicing network equipment in a variety of settings including being used to hang from a cart, a technician's body, or a server rack. The next figure shows an example of a server rack in which the container caddy can be used.

Figure 1:
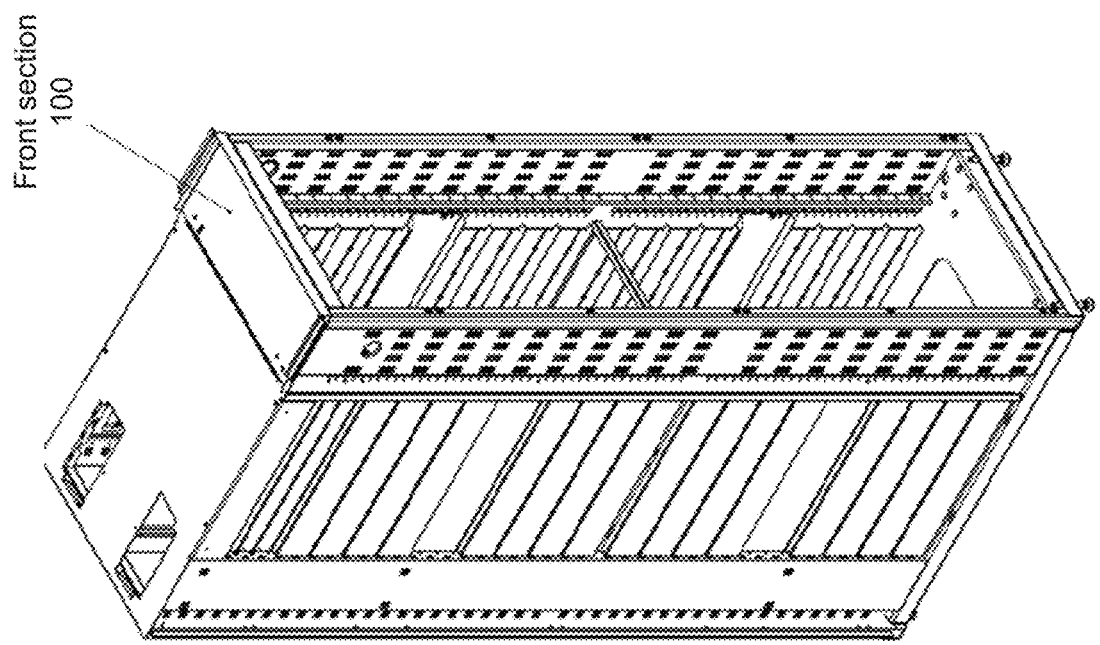
FIG. 1 shows an example of a server rack in which a container caddy for computer network transceivers is provided.

FIG. 1 shows an example of a server rack in which a container caddy for computer network transceivers can be provided. This example shows a single rack column. The number and placement of racks is exemplary and not intended to be limiting. For example, rack columns may be grouped into several (e.g., three rack columns). The container caddy finds application in a variety of network equipment that use optical transceiver modules, i.e., not necessarily limited to racks.

The rack is adapted to hold equipment/components such as computer network switches, power devices, and servers. In this example, the shelves of the server rack are empty, but the grooves on the sides of the rack indicate places where equipment can slide into the rack. The rack-mounted components provide server functionalities such as servicing requests and supporting applications and services. One type of rack-mounted component is a computer network switch. A computer network switch (also known as a top-of-rack "TOR" switch) provides control of one or more racks by managing components within the rack and facilitating communications between racks. An example of a TOR switch is a Facebook® Wedge switch, which is an OS-agnostic switch that includes a server module. Components such as the server module in the Wedge switch can be easily modified and replaced according to networking needs and when new technology becomes available. Another example of a switch is a modular network switch such as Facebook® Backpack and Facebook® Minipack.

A modular network switch includes a device chassis that can be mounted to a server rack. The device chassis is adapted to house modular removable components such as interface modules (also called port interface modules or PIMs) and a system control module. The system control module is a processing unit configured to manage the interface modules. For example, the system control module manages networking policies, temperature control, power distribution, and the like. Each of the interface modules includes a port for receiving data from an external device in a network and at least one application-specific integrated circuit (ASIC) for data forwarding (e.g., gearbox). An example of an interface module is shown in FIG. 2.

The rack may be a variety of sizes such as 19 inches tall or may be implemented in accordance with the Open Compute Project standard (e.g., Open Rack V2) having a rack height of around 87 inches or 42 open rack units. In the Open Compute Project standard, an open rack unit or "OU" is a unit for the height of a chassis mounted in the rack. 1 OU is 48 mm high. Rack-mounted components can be sized in terms of OUs. For example, some types of interface modules are 4 OUs tall. A container caddy assembly for such interface modules can be sized to be shorter than the interface modules.

Figure 6:
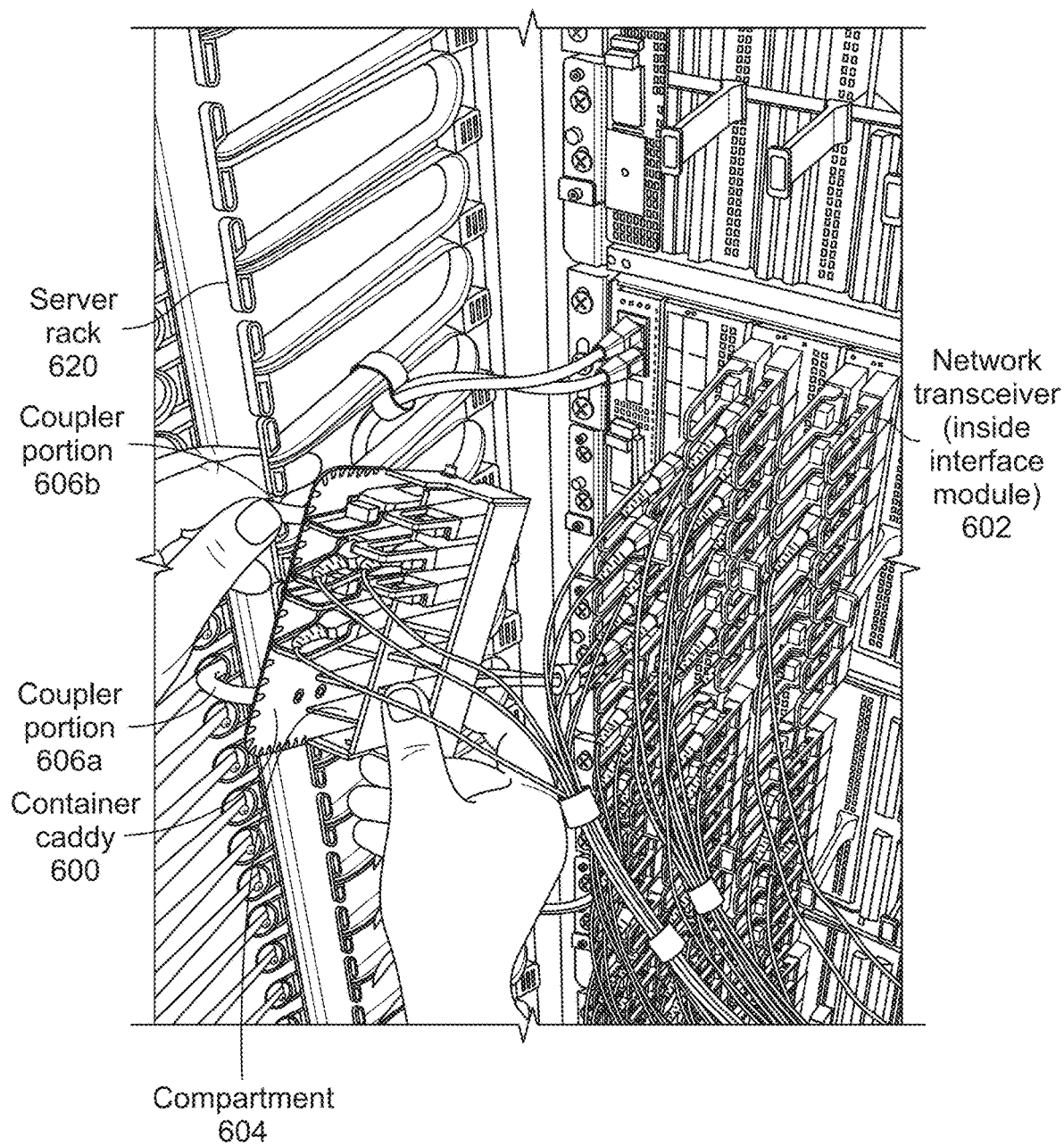
FIG. 6 shows an example of a container caddy assembly hanging on a server rack.

A container caddy assembly can be hung from the server rack. Front section 100 indicates a front area of the server where components such as interface modules can slide into and out of the rack. The front section includes a top, bottom, left side, and right side. Here, the left and right sides have openings and the container caddy assembly can be hung from these openings as shown in FIG. 6. In some embodiments, a server rack includes auxiliary components (not shown). One example of an auxiliary component is a hinged panel attached to the front section like a diptych or triptych. Another example of an auxiliary component is a vertical cable manager, which is provided alongside the server to help manage the cables. The container caddy assembly can be removably attached to an auxiliary component.

FIG. 2 shows an example of an interface module with network transceivers for which a container caddy for computer network transceivers can be used. The interface module can be part of a network switch, which is in turn mounted on a server rack.

An interface module (also called a port interface module or PIM) provides switching operations. An interface module receives data packets and forwards the data packets to the appropriate destination. For example, an interface module receives an optical signal, converts the signal to a signal for a switch chip, and sends the signal to the switch chip, to then route the signal to a destination. The interface module allows processing units (CPUS, GPUs, or the like) to be easily repaired or replaced while other components of the network switch remain in place. For example, removable network switch interface modules are housed in the chassis, where each of the removable network switch interface modules includes a circuit board with associated switch circuitry.

An interface module supports a variety of card configurations such as Quad Small Form-factor Pluggable (QSFP), dense wavelength division multiplexing (DWDM), and the like. One type of interface module has 16 slots supporting 100 G per slot. Another type of interface module has 4 slots supporting 400 G per slot. Other configurations are also possible, such as 8×QSFP56 200 G. In some embodiments, within a chassis, one or more types of network interfaces are used. A chassis may include all network interfaces of the same type or more than one type of network interface. The modular, replaceable nature of the network interfaces allow them to be easily replaced, removed, and mingled in the same chassis.

The example pictured here is a 16Q interface module and has 16 QSFP28 ports where each port capable of supporting a 100 G optic transceiver. Here the outer 12 ports have QSFP transceivers 202 plugged in while the inner four QSFP transceivers have been removed to clearly show the ports 204.

A plurality of these interface modules can be installed in a modular network switch device chassis. They may each be arranged next to each other in the front portion of the chassis. Each may have one or more ejectors for installing and retaining the interface module in position in the chassis, and later removing the interface module.

The container caddy assembly will be described using the example of a 16Q interface module, but is not limited to QSFP transceivers and can be used for a variety of other types of interface modules. The next figure shows a container caddy assembly.

Figure 3B:
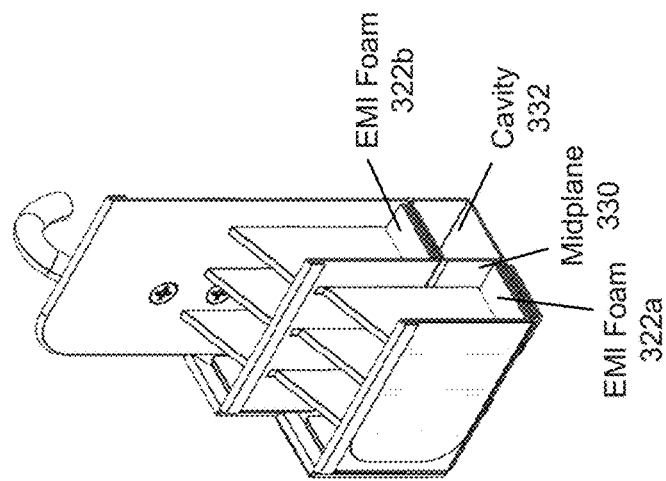
FIG. 3B is a diagram illustrating a cross-section of an embodiment of a container caddy assembly.
Figure 3A:
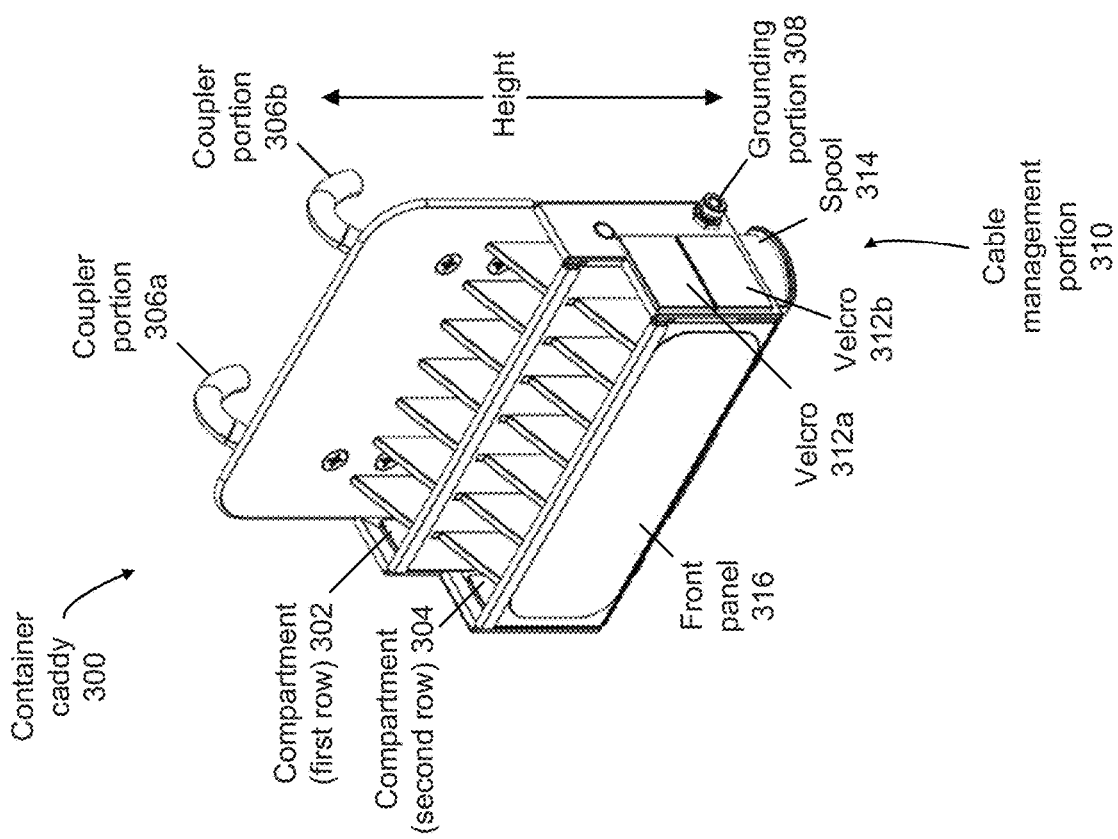
FIG. 3A is a diagram illustrating an embodiment of a container caddy assembly.

FIG. 3A is a diagram illustrating an embodiment of a container caddy assembly. The container caddy assembly includes a container caddy 300 with compartments 302 and 304, a coupler portion 306a and 306b, and a grounding portion 308.

The compartments are arranged in two rows. In this example there are 8 compartments in each row. Compartment 302 is the left-most compartment in the first row and compartment 304 is the left-most compartment in the second row. Each compartment can hold one or more transceivers.

Each compartment (of at least a subset of the compartments shown) is configured to hold a corresponding computer network transceiver corresponding to a port of a computer networking equipment. In other words, each compartment in the caddy corresponds to a specific port of a computer networking equipment. During maintenance suppose a technician wants to remove transceivers from a computer networking equipment such as an interface module. The technician can use the caddy by removing a transceiver for a specific port of the interface module and placing it in a corresponding compartment in the caddy.

Referring to FIG. 6, where the transceivers 602 are plugged into the interface module, a technician may unplug a transceiver from a port in the interface module and place it in the corresponding compartment 604 in the container caddy 600. The correspondence of compartment to ports keeps the transceivers organized when they are removed from the interface module.

Figure 7:
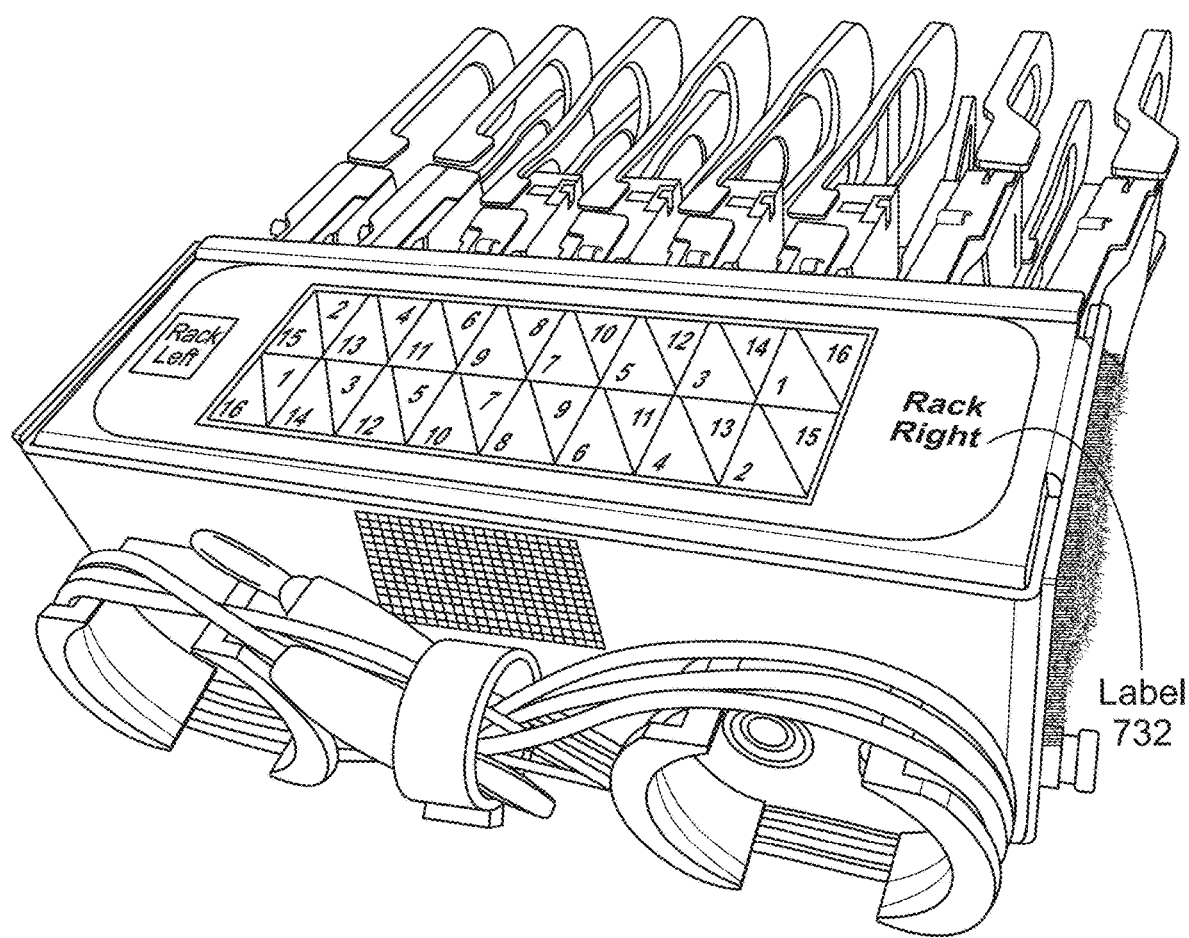
FIG. 7 shows an example of a label for a container caddy assembly.

In some embodiments, the container caddy includes front panel 316. Instructions or labels can be affixed to the front panel. The numbering of ports and correspondence to the compartments can be displayed on the front panel (a printed label, digital label, etc.). An example of an organization scheme and numbering label is shown in FIG. 7.

Figure 8B:
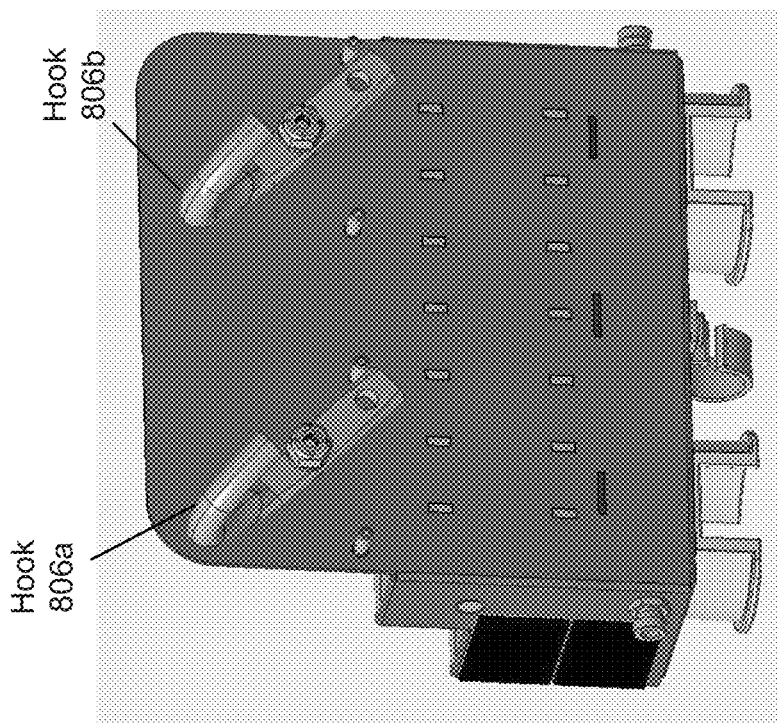
FIG. 8B is a diagram illustrating an embodiment of a container caddy assembly for computer network transceivers having a hook in a second position.
Figure 8A:
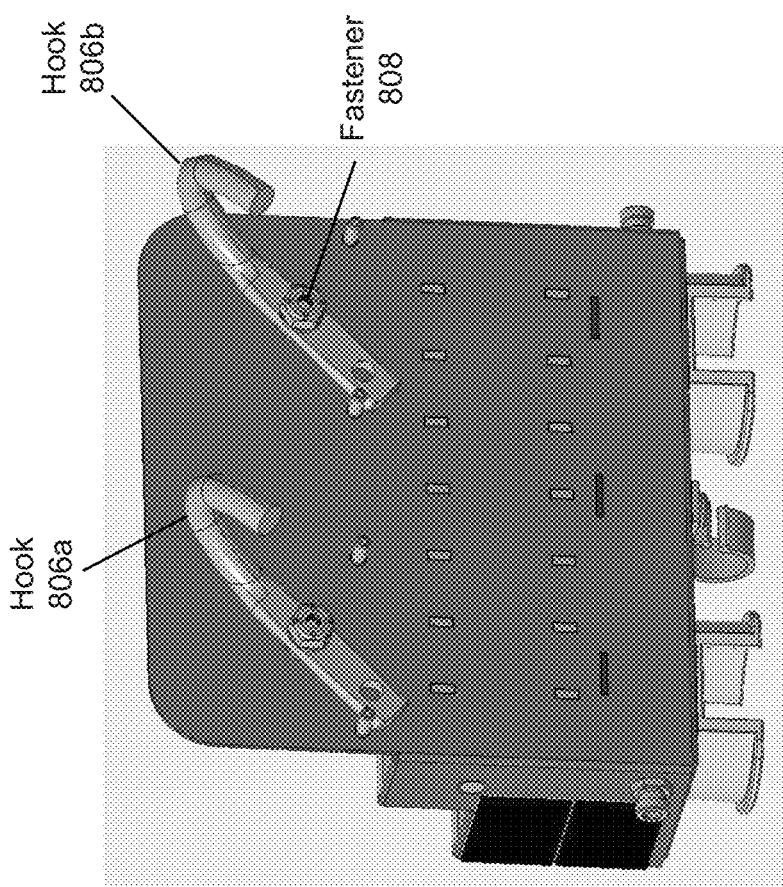
FIG. 8A is a diagram illustrating an embodiment of a container caddy assembly for computer network transceivers having a hook in a first position.
Figure 9:
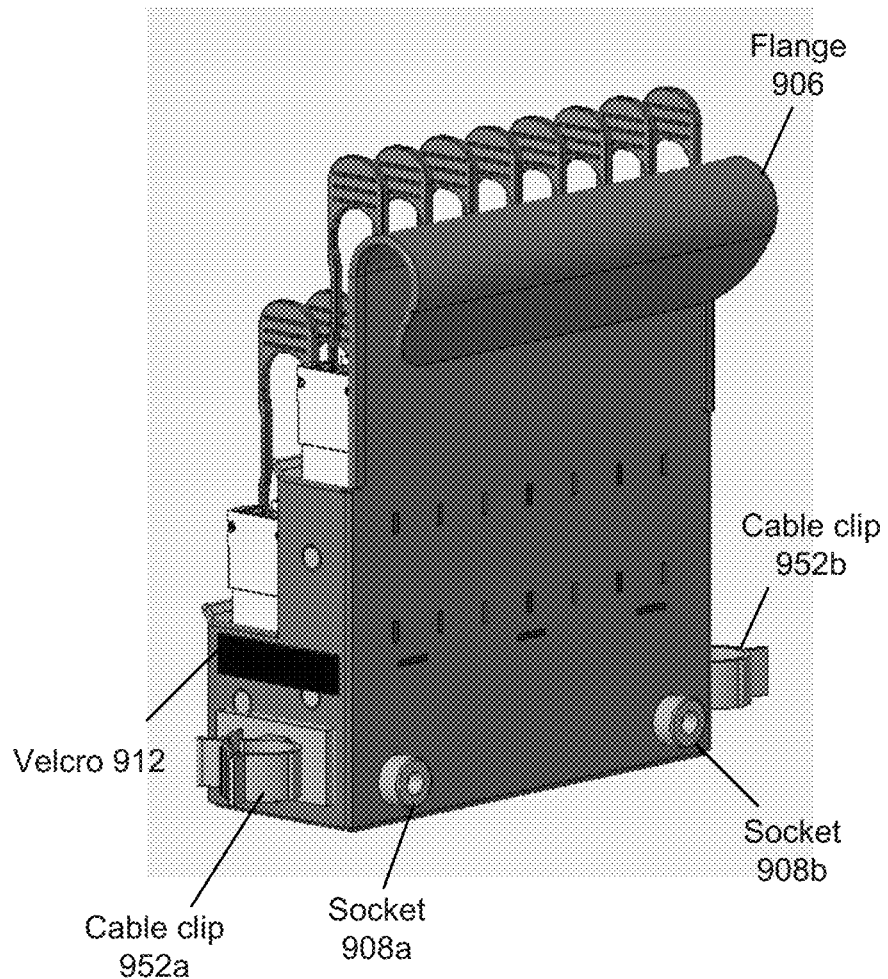
FIG. 9 is a diagram illustrating an embodiment of a container caddy assembly for computer network transceivers having a flange.

Coupler portion 306a and 306b is configured to allow the container caddy assembly to be removably hung on an external object such as a server rack, cart, technician's body, etc. The coupler portion here includes two hooks to removably attach the caddy to something else. Other types of couplers such as flanges, carabiners, and the like may be used instead or in addition to these hooks. The number and placement of hooks (forming the coupler portion) is merely exemplary and not intended to be limiting. Examples of a coupler portion are shown in FIGS. 8A, 8B, and 9.

Figure 10:
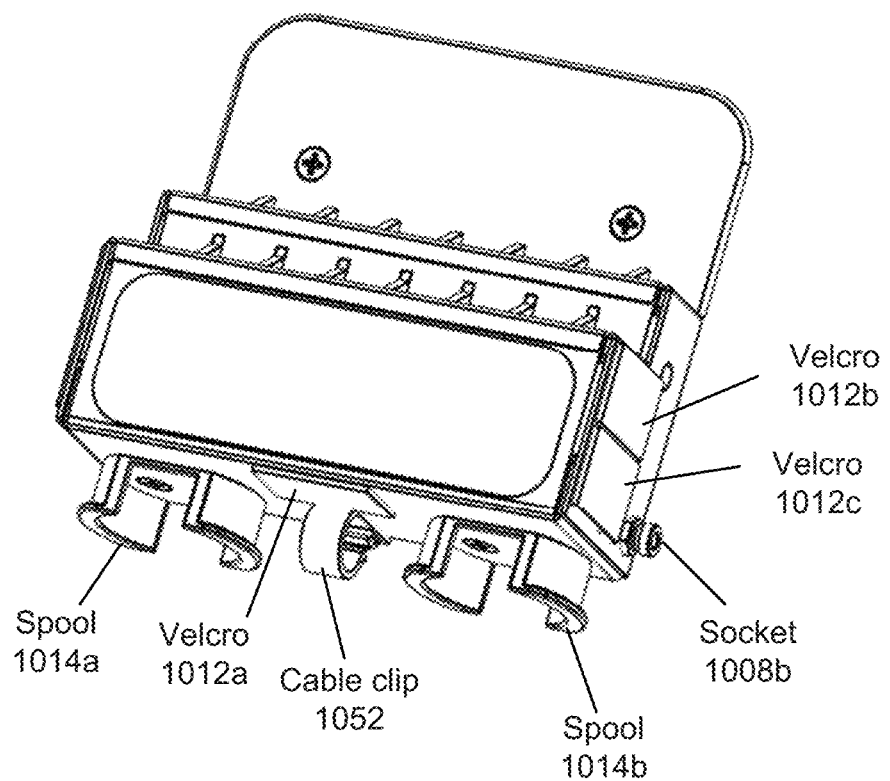
FIG. 10 is a diagram illustrating an embodiment of a grounding mechanism and a cable management mechanism for a container caddy assembly.
Figure 11:
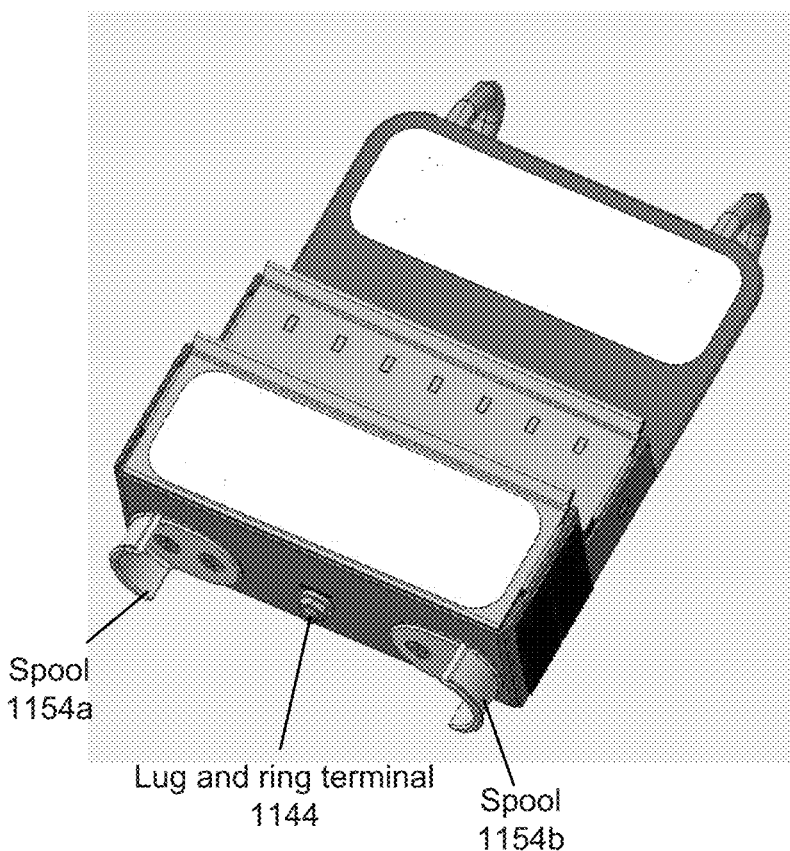
FIG. 11 is a diagram illustrating another embodiment of a grounding mechanism and a cable management mechanism for a container caddy assembly.

Grounding portion 308 is configured to provide electrostatic discharge grounding. The container caddy may be sensitive to electrostatic because it holds electronic components such as transceivers. Static can damage the electronic components, and damage can be prevented by grounding the container caddy. The grounding portion here is a socket adapted to receive a grounding cable so that one end of the cable plugs into the container caddy while the other end plugs into a grounding source such as the server rack. Examples of a grounding portion are shown in FIGS. 10 and 11.

In some embodiments, the container caddy includes a cable management portion 310. One of the advantages of the container caddy is that transceivers can be placed in the compartments with their cables still coupled (attached) to the transceivers. In addition, a grounding cable can be plugged into the caddy to provide electrostatic discharge. The cables can be managed using a variety of cable management devices. In this example, velcro 312a and 312b and spool 314 are part of the cable management portion. Velcro (or other types of adhesive) can be used to attach cable ties (such as cable ties used for optical fiber connected to transceivers) to the sides or bottom of the caddy to keep the cables organized and out of the way of the compartments. Grounding cables can be wound around the spool. In various embodiments, cable management components on the bottom of the caddy are for organizing the grounding cable while cable management components on the sides of the caddy are for managing network (e.g., optical transceiver) cables. Examples of a cable management portion are shown in FIGS. 10 and 11.

FIG. 3B is a diagram illustrating a cross-section of an embodiment of a container caddy assembly. The cross-section is taken in the y-z plane and shows the interior of a compartment and the tiering of the two rows of compartments.

In some embodiments, the compartments can be lined on one or more sides (including the bottom). For example, a cushioning material such as foam or a gasket can be placed on the bottom and/or sides of the compartment to protect the transceivers from physical damage. The cushioning material can also provide electrostatic discharge. In this example, each compartment has anti-static (EMI) foam 322a and 322b on the bottom of the compartment.

The rows can be tiered as shown so that the compartments in rows closer to the back of the caddy are higher than rows closer to the front of the caddy. Here the first row is higher than the second row. This may make transceivers sitting in the compartments easier to grasp. A step-shaped midplane 330 can provide support for the compartments. The step-shape midplane creates a cavity (or clearance area) 332 under the (higher) first row, which is a space to store various hardware such as extra cable, nuts, standoffs, or other hardware needing depth that is not otherwise available.

The container caddy assembly can be sized to fit on a server rack such as the one shown in FIG. 1 or can be sized based on computer network equipment with which the caddy is used. In various embodiments, the height of the container caddy assembly is 3 rack units or OUs or around 7 inches tall. For example, if a computer network equipment such as the chassis of an interface module is 4 OUs tall, then the caddy can be sized to be shorter than the interface module (such as 3 OUs). The width of the container caddy assembly is sized based on the transceivers the caddy accommodates such as 8.5 mm×18.25 mm×72.4 mm for QSFP transceivers. Thus the container caddy is relatively small and portable, and several container caddy assemblies can be hung on the server rack without interfering with each other.

The container caddy depicted here is empty without holding electronic components in any of the compartments. The next figure shows an example with transceivers in the compartments.

Figure 4:
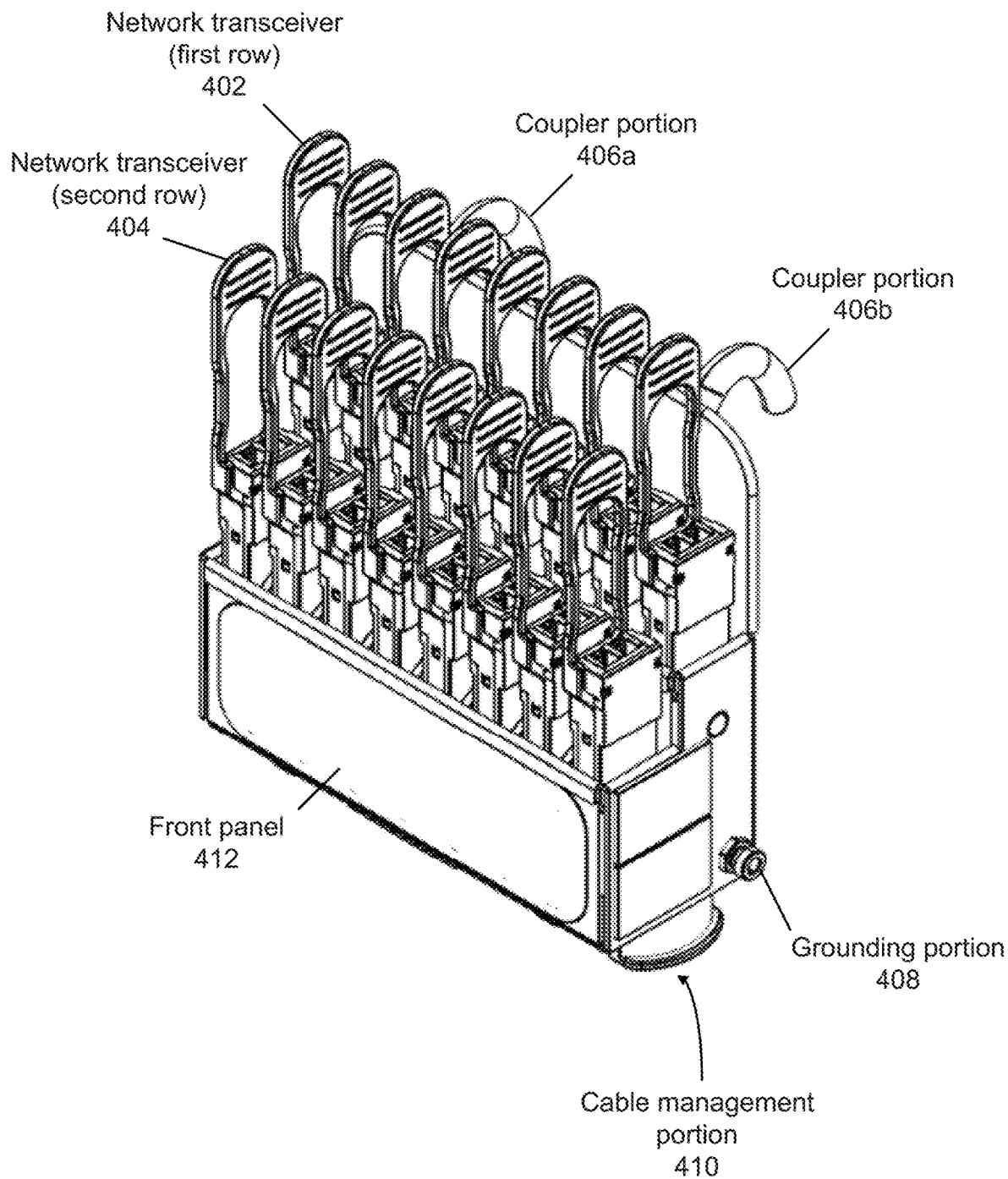
FIG. 4 is a diagram illustrating an embodiment of a container caddy assembly filled with computer network transceivers.

FIG. 4 is a diagram illustrating an embodiment of a container caddy assembly filled with computer network transceivers. The container caddy assembly includes a container caddy with a network transceiver in each compartment, a coupler portion 406a and 406b, a grounding portion 408, cable management portion 410, and front panel 416. The transceiver in the left-most compartment in the first row is transceiver 402 and the transceiver in the left-most compartment in the second row is transceiver 404. The other transceivers are not labeled to more clearly illustrate the caddy assembly. This caddy stores 8 transceivers in each row for a total of 16 transceivers. In an alternative embodiment, the compartments can be sized to received multiple transceivers in each compartment such as two in each compartment for a total of 32 transceivers. In various embodiments, the caddy assembly is modular meaning that two or more can be joined to accept more than 16 network transceivers. Each of the components is like their counterparts in FIGS. 3A and 3B. The transceiver can be any type of network transceiver as described with respect to FIGS. 1 and 2. Here they are QSFP transceivers.

FIGS. 3A-4 depict the caddy in a vertical orientation where the transceivers are oriented vertically when the caddy is hung from a server rack. In an alternative embodiment, the caddy is oriented horizontally so that the when the caddy is hung from the server rack the transceivers are oriented horizontally as shown in the following figure.

Figure 5:
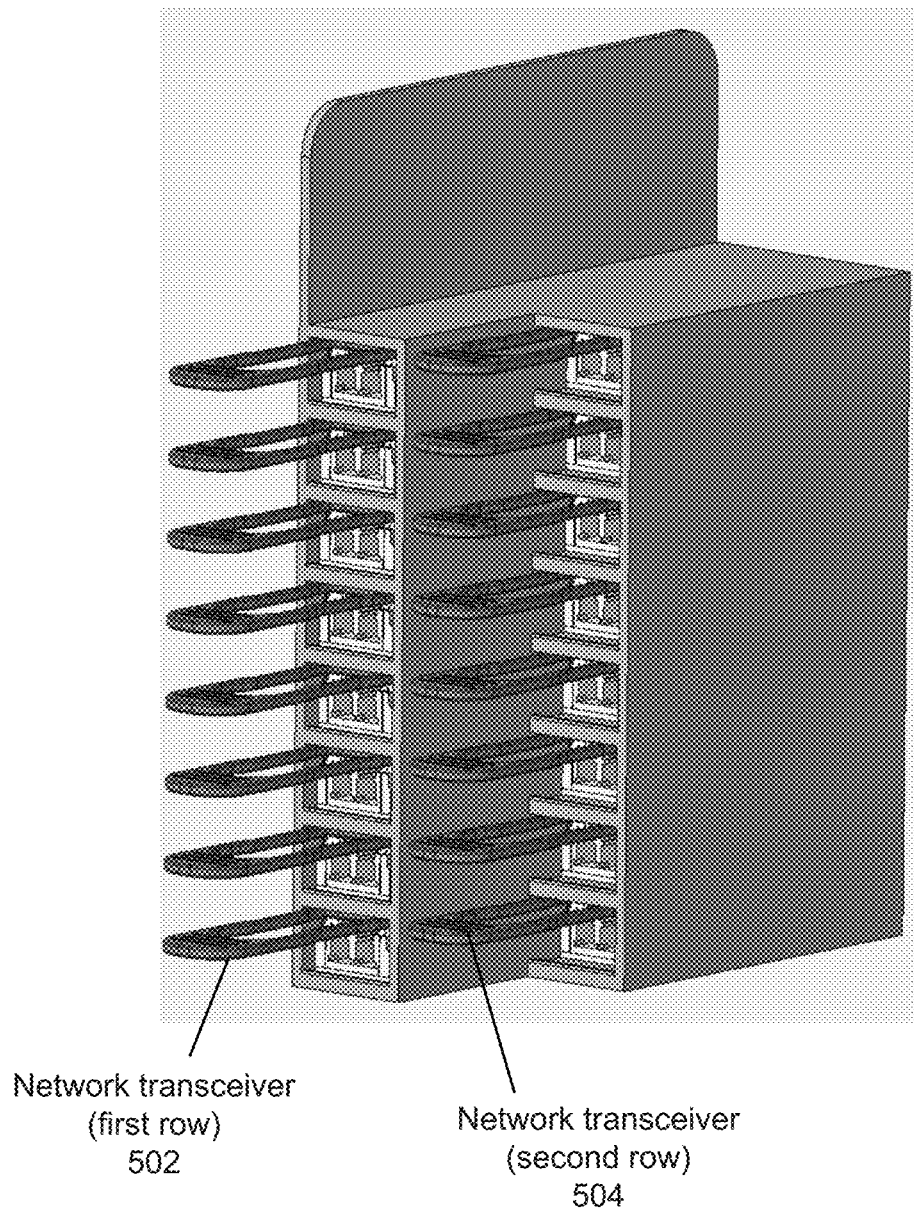
FIG. 5 is a diagram illustrating an embodiment of a container caddy assembly for computer network transceivers in a horizontal orientation.

FIG. 5 is a diagram illustrating an embodiment of a container caddy assembly for computer network transceivers in a horizontal orientation. Compared with the vertical caddy of the previous figures, the compartments here are deeper (e.g., on the order of 80 mm deep) to prevent the transceivers from falling out. In some embodiments, the caddy includes a bump feature that provides some resistance in the compartments so that the transceivers do not easily fall out. One benefit of a horizontally oriented caddy is that some technicians may find the transceivers easier to handle (e.g., remove and insert) in this orientation. Another benefit is that cable management can be easier.

For context, the transceiver in the bottom-most compartment in the first row is transceiver 502 and the transceiver in the bottom-most compartment in the second row is transceiver 504. Some of the components are omitted in this example for purposes of illustration. This caddy may have at least some of the same components as the example shown in FIG. 4 such as a coupler portion, grounding portion, cable management portion, and front panel.

FIG. 6 shows an example of a container caddy assembly hanging on a server rack. In this example state, the container caddy is empty, the network transceivers are plugged into ports of the interface module, and the interface module is sitting in the server rack as shown. For context, the right-most compartment in the second row of the caddy is compartment 604. Coupler portion 606a and 606b are shown hanging from server rack 620. The server rack is an example of an external object to which the container caddy is removably attached. In some embodiments, caddy is attached to server auxiliary components such as a vertical cable manager. In this example, the caddy has two numbering labels. The next figure explains what information can be included in the numbering labels.

FIG. 7 shows an example of a label for a container caddy assembly. The container caddy assembly shown here can include at least some of the same components as the one shown in FIGS. 3A and 3B. For clarity, some of the components are omitted in order to explain the numbering label. The caddy can be hung from several different places on a rack. Depending on where the caddy is hung, the caddy compartments may correspond to different ports in the interface module.

In this example, the caddy includes a label 732 with two sets of numbers, one black and one white. The numberings indicate a compartment and its corresponding port in the interface module. If the caddy is hung from the one side of a server rack (e.g., right rack), then the technician can consult one set of numbers (e.g., the white rack right numbering) and insert the transceivers in the appropriate compartments in that order. If the caddy is hung from an opposite side of the rack (e.g., left rack), then the technician can consult the other set of numbers (e.g., the black rack left numbering) and insert the transceivers in the appropriate compartments in that order. In other words, the label includes two sets of numbers where one set (rack left numbering) is used when the caddy is attached to the left side of the rack and the other set (rack right numbering) is used when the caddy is attached to the right side of the rack. Referring to the top left box, rack right numbering is "2" and rack left number is "15," meaning "2" is used when the caddy is attached the left side of the rack and "15" is used when the rack is hung on the left.

There are a variety of ways that a caddy can be removably coupled to an external object. The following figures show examples of a coupler portion of a caddy for coupling to external objects.

FIG. 8A is a diagram illustrating an embodiment of a container caddy assembly for computer network transceivers having a hook in a first position. The caddy can be coupled to network equipment, a technician cart, a body of a technician or other things. In this example, two hooks 806a and 806b are examples of a coupler portion that removably couples the caddy to an external object such as a server rack. The hooks can be rigid or have multiple degrees of freedom. For example, the hooks can be attached to the back of the container caddy by fastener 808 which can be a screw as shown or other fastening means. The hooks can be movable about the fastener. Here, the hooks are rotated to the left about the fastener.

FIG. 8B is a diagram illustrating an embodiment of a container caddy assembly for computer network transceivers having a hook in a second position. In this example, hooks 806a and 806b have been removed relative to FIG. 8A by rotating to the right about the fastener.

FIG. 9 is a diagram illustrating an embodiment of a container caddy assembly for computer network transceivers having a flange. Flange 906 is an example of a coupler portion that removably couples the caddy to an external object such as server rack. Compared with the hooks, the flange may be easier to handle with a single hand but uses more material than hooks. The flange can be integrated with the back of the container caddy and formed during fabrication of the caddy by bending back a portion of the back of the container caddy to form the flange with sufficient space between the back and the curved portion of the flange to hang on a server rack or other external object.

In some embodiments, rather than or in addition to hooks or a flange, the back of the caddy may have one or more holes or receptacles to accommodate a carabiner for attaching the caddy to an external object.

The container caddy may have a number of grounding and cable management features, which are further discussed in the following figures.

FIG. 10 is a diagram illustrating an embodiment of a grounding mechanism and a cable management mechanism for a container caddy assembly. The caddy may have other components such as the ones shown in FIGS. 3A and 3B but are omitted here for purposes of illustration.

The grounding mechanism here includes socket 1008b, which is provided on a side of a container caddy. The left side of the caddy is not visible in this view, but in some embodiments the caddy includes a pair of sockets so that left side also includes a socket symmetrically placed on the container caddy to socket 1008b. Socket 1042b is adapted to receive a grounding cable. The cable couples the caddy to ground such as a server rack. Two sockets can be provided meaning that multiple caddies can be daisy chained. The socket can be a banana socket or the like.

The number and placement of sockets is merely exemplary and not intended to be limiting. Referring to FIG. 9, a different example placement of sockets 908a and 908b is shown on the back of the caddy. One benefit of providing sockets here is that more space may be available when hanging multiple caddies next to each other on a cable management area of the rack.

Returning to FIG. 10, the grounding cable can be managed using cable management techniques by winding the cable through cable clip 1052 and spools 1014a and 1014b. For example the cable can simply be wound around the spools or wound in a figure-8 to shorten the length of the grounding cable. The cable clip can be tightened to control slack of the grounding cable.

Other types of cables can also be managed with cable management features of the caddy. For example, optical fiber attached to transceivers that are held in the compartment of the caddy can be bundled together with cable ties. The sides or bottom of the caddy can have devices to hold the cables in place. Referring to FIG. 9, cable clips 952a and 952b on the sides of the caddy are configured to hold cables or cable ties. Returning to FIG. 10, Velcro 1012a, 1012b, and 1012c can hold cables or cable ties. This keeps the cables out of the way which a technician services the network equipment without needing to unplug the cables. Velcro or any other type of suitable adhesive can be used (FIGS. 3A, 3B, 9, and 10 uses Velcro as an example but this is not intended to be limiting). A combination of cable clips, adhesives, and other cable management devices can be used. In FIG. 9 the left side of the caddy has Velcro 912 and a cable clip 952*a*. A cable tie can be removably attached to the Velcro 912 and the cables run through clip 952*a*. The number and placement of adhesives (Velcro) is merely exemplary and not intended to be limiting.

FIG. 11 is a diagram illustrating another embodiment of a grounding mechanism and a cable management mechanism for a container caddy assembly. The caddy shown here has the same components as the one shown in FIGS. 6 and 7 unless otherwise described. Unlike the caddy in FIG. 10 which has sockets on the side for grounding, the caddy here has a lug and ring terminal 1144. The lug and ring terminal is adapted to receive a grounding cable to connect the caddy to ground such as a server rack. The grounding cable can be organized using a cable management technique such as the ones described above. For example, the cable can be wound around spools 1154*a* and 1154*b*. The example spool shown here is different from the one in FIG. 10 and can be made using less material.

The container caddy assembly disclosed here can be adapted for a variety of network transceivers including different numbers of transceivers. For example, another type of modular network switch is a 4DD (double dense) switch. A container caddy for a 4DD switch may have fewer slots such as 16 slots or the same container caddy may be used to service twice as many 4DD PIMs.

The container caddy assembly disclosed here has many benefits. The caddy reduces the service time required to replace network equipment such as interface modules. The caddy protects its contents (e.g., transceivers) and attachments (e.g., fiber cables) from physical and static damage during the servicing period. The container caddy does not require any special tools to operate and is easy to handle with a simple coupler (e.g., hook) to attach to a cable tray in the left or right side of a server rack. The caddy reduces the need to move the interface module and fiber farther away from the rack because it allows the components to be kept nearby and connected during servicing.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. An assembly comprising:
   a container caddy including a plurality of compartments corresponding to at least a portion of ports of a computer networking equipment, wherein each compartment of at least a portion of the plurality of compartments is configured to hold a corresponding computer network transceiver corresponding to a corresponding port of the ports of the computer networking equipment;
   a coupler portion configured to allow the assembly to be removably hung on an external object;
   a grounding portion configured to provide electrostatic discharge grounding and provided on an underside of the assembly; and
   a cable management portion provided on the underside of the assembly.

2. The assembly of claim 1, wherein the plurality of compartments is arranged in a plurality of tiered rows including a first row that is higher than a second row.

3. The assembly of claim 1, wherein the plurality of compartments accommodates up to 32 computer network transceivers.

4. The assembly of claim 1, wherein the coupler portion includes a hook.

5. The assembly of claim 1, wherein the coupler portion includes a flange.

6. The assembly of claim 1, wherein the coupler portion includes a receptacle for a carabiner.

7. The assembly of claim 1, wherein the external object is a server rack and the assembly is adapted to attach to the server rack via the coupler portion.

8. The assembly of claim 1, wherein the external object is a vertical cable manager and the assembly is adapted to attach to the vertical cable manager via the coupler portion.

9. The assembly of claim 1, further comprising a label indicating a compartment and its corresponding port.

10. The assembly of claim 9, wherein the label is for a first side of a rack to which the container caddy is attachable and further comprising a second label for an opposite side of a rack indicating a compartment and its corresponding port.

11. The assembly of claim 1, wherein the cable management portion is adapted to manage cabling of the computer network transceiver.

12. The assembly of claim 11, wherein the cable management portion includes a cable clip provided on the underside of the assembly.

13. The assembly of claim 11, wherein:
   the cable management portion includes a plurality of spools adapted to receive a cable; and
   the grounding portion is provided between at least two of the plurality of spools.

14. The assembly of claim 1, wherein the grounding portion includes at least one socket adapted to receive a grounding cable to ground the assembly to a rack.

15. The assembly of claim 14, wherein the at least one socket is adapted to daisy chain a plurality of assemblies.

16. The assembly of claim 14, wherein the at least one socket includes a banana socket.

17. The assembly of claim 1, wherein the grounding portion includes an anti-static foam section at a bottom of a compartment.

18. The assembly of claim 1, wherein the assembly is 3 rack units tall.

19. The assembly of claim 1, wherein the computer network transceiver is an optical transceiver.

20. The assembly of claim 1, wherein the computer network transceiver remains coupled to its cable while in the container caddy.

21. The assembly of claim 1, wherein the grounding portion includes a lug and ring terminal.

* * * * *